(12) United States Patent
Kao et al.

(10) Patent No.: US 10,153,329 B2
(45) Date of Patent: Dec. 11, 2018

(54) METHOD OF MANUFACTURING DISPLAY PANEL

(71) Applicant: EverDisplay Optronics (Shanghai) Limited, Shanghai (CN)

(72) Inventors: Chih-Hao Kao, Shanghai (CN); Jr-Hong Chen, Shanghai (CN)

(73) Assignee: EverDisplayOptronics (Shanghai) Limited, Shanghai (CN)

( * ) Notice: Subject to any disclaimer, the term of this patent is extended or adjusted under 35 U.S.C. 154(b) by 59 days.

(21) Appl. No.: 15/613,482

(22) Filed: Jun. 5, 2017

(65) Prior Publication Data

US 2018/0240849 A1   Aug. 23, 2018

(30) Foreign Application Priority Data

Feb. 21, 2017   (CN) .......................... 2017 1 0093144

(51) Int. Cl.
| | |
|---|---|
| *H01L 27/32* | (2006.01) |
| *H01L 29/49* | (2006.01) |
| *H01L 29/786* | (2006.01) |
| *H01L 51/52* | (2006.01) |
| *H01L 31/0256* | (2006.01) |
| *G03F 7/20* | (2006.01) |
| *G03F 7/34* | (2006.01) |

(52) U.S. Cl.
CPC ............ *H01L 27/32* (2013.01); *G03F 7/2024* (2013.01); *G03F 7/343* (2013.01); *H01L 29/4908* (2013.01); *H01L 29/7869* (2013.01); *H01L 29/78696* (2013.01); *H01L 31/0256* (2013.01); *H01L 51/5253* (2013.01)

(58) Field of Classification Search
CPC . H01L 27/32; H01L 51/5253; H01L 29/4908; H01L 29/78696; G03F 7/2053; G03F 7/343; G03F 7/42; G03F 7/2022; G03F 7/2024; G03F 7/2026; G03F 7/203
USPC ..................................... 430/319, 321; 445/24
See application file for complete search history.

(56) References Cited

U.S. PATENT DOCUMENTS

| | | | |
|---|---|---|---|
| 6,593,687 B1 * | 7/2003 | Pei .......................... | C07C 211/56 313/504 |
| 2007/0190886 A1 * | 8/2007 | Satoh ......................... | H01J 9/02 445/24 |
| 2015/0001497 A1 * | 1/2015 | Jung .................... | H01L 51/5253 257/40 |

(Continued)

*Primary Examiner* — John A McPherson
(74) *Attorney, Agent, or Firm* — Yunling Ren

(57) ABSTRACT

The present disclosure discloses a method of manufacturing a display panel. The method includes: providing a first substrate, and forming a release layer on the first substrate; forming a thin film transistor driving layer on the first substrate; forming a display element on the first substrate, wherein a part of the display element forms above the release layer and another part of the display element forms above the thin film transistor driving layer; separating the release layer and the first substrate with a laser; removing the release layer and the display element above the release layer, and forming a hollow portion on the first substrate; packaging the display element to form a display panel, wherein the display panel at least includes a first packaging portion; and providing a through hole passing through the display panel at a region on the display panel corresponding to the hollow portion.

10 Claims, 11 Drawing Sheets

(56) References Cited

U.S. PATENT DOCUMENTS

2016/0181347 A1* 6/2016 Lou .................. H01L 51/52
260;257/40

* cited by examiner

METHOD OF MANUFACTURING DISPLAY PANEL

CROSS REFERENCE

This application claims priority to Chinese Patent Application No. 201710093144.X, filed on Feb. 21, 2017, the entire contents thereof are incorporated herein by reference.

TECHNICAL FIELD

The present disclosure relates to the field of display, and more particularly, to a method of manufacturing a display panel.

BACKGROUND

An OLED display panel has many advantages, such as high color gamut, high contrast, light weight, thin volume, power saving or the like, which has gradually replaced an LCD display panel in the field of flat panel display and has been widely used in mobile phones nowadays. With the development of mobile technology, digital products are becoming more and more functionalization, miniaturization and portability. A smart watch as the representative of the wearable product has begun to emerge in the market. A smart wearable device, as a new product in recent years, has attracted more and more attention from the market, and it has become a product comparable to the mobile phone due to its stylish shape, functional diversity and convenience to carry. In order to improve the display performance of the smart wearable device and to achieve its miniaturization, the smart wearable device has also used the OLED display panel at present.

In order to make the display panel of the smart wearable device have a higher degree of freedom of appearance design and closer to the requirements of a user, it is inevitable that a through hole is required on the display panel of the smart wearable device. For example, as for a smart watch, the user prefers to add pointer design of a traditional mechanical pointer watch on the basis of the smart watch. Therefore, the through hole needs to be provided on the display panel in order to set the pointer.

However, at present, the packaging technology of the OLED display panel is mainly divided into two categories, one category uses materials such as a ultraviolet (UV) curing adhesive or a glass (Frit) cement to bond a substrate and cover plate together, so as to achieve a sealing effect; the other category uses a thin film encapsulation (TFE) process, so as to achieve an effect of blocking water and/or oxygen by depositing a water-resistant thin film layer on the substrate. However, regardless of which of the above two types of technology is used to package the display panel, after a through hole is provided in the center of the display panel, neither of them may prevent external water and/or oxygen permeating into the display panel via the through hole and contacting with the display element, which affects the display performance of the display element and even causes invalidation of the display element.

SUMMARY

With respect to problems existing in the prior art, the present disclosure aims to provide a method of manufacturing a display panel. The method of manufacturing the display panel may provide a through hole on the display panel and prevent water and/or oxygen permeating into the display panel via the through hole and contacting with a display element.

According to an aspect of the present disclosure, there is provided a method of manufacturing a display panel, the method includes following steps: providing a first substrate, and forming a release layer on the first substrate; forming a thin film transistor driving layer on the first substrate, and the thin film transistor driving layer surrounding the release layer; forming a display element on the first substrate, wherein a part of the display element forms above the release layer and another part of the display element forms above the thin film transistor driving layer; separating the release layer and the first substrate with a laser; removing the release layer and the display element above the release layer, and forming a hollow portion on the first substrate; packaging the display element to form a display panel, wherein the display panel at least includes a first packaging portion formed on the first substrate and at least surrounding the hollow portion; and providing a through hole passing through the display panel at a region on the display panel corresponding to the hollow portion, and the first packaging portion surrounding the through hole.

According to an embodiment, in the step of forming the release layer on the first substrate, a ployimide material or an organic photoresist is coated on the first substrate, and the release layer is formed after exposure and development.

According to an embodiment, the step of packaging the display element further includes following sub-steps: coating a packaging adhesive on the first substrate, wherein the packaging adhesive is coated surround the hollow portion and the display element, respectively; covering a second substrate above the first substrate; and curing the packaging adhesive to form the first packaging portion and a second packaging portion, and bonding the first substrate and the second substrate, wherein the first packaging portion surrounds the hollow portion and the second packaging portion surrounds the display element.

According to an embodiment, the packaging adhesive is a ultraviolet curing adhesive, which is cured after being irradiated by a ultraviolet ray to bond the first substrate and the second substrate.

According to an embodiment, the packaging adhesive is a glass cement, which is cured after laser sintering to bond the first substrate and the second substrate.

According to an embodiment, the step of packaging the display element further includes following sub-steps: alternatingly depositing an inorganic thin film layer and an organic thin film layer on the first substrate until the display element is covered, wherein the inorganic thin film layer and the organic thin film layer form the first packaging portion and a third packaging portion, the first packaging portion forms at the hollow portion, and the third packaging portion surrounds and covers the display element.

According to an embodiment, the organic thin film layer is made of acrylate-based resin material, and the inorganic thin film layer is made of silicon nitride material, aluminium oxide material or titanium dioxide material.

According to an embodiment, the step of separating the release layer and the first substrate with the laser is performed in a nitrogen environment.

According to an embodiment, the step of removing the release layer and the display element above the release layer is performed in a nitrogen environment.

According to an embodiment, the through hole provided on the display panel has a diameter of 1 cm to 3 cm.

The method of manufacturing a display panel according to the present disclosure combines photolithography technique with evaporation technique, a release layer is formed on a first substrate through the photolithography technique prior to depositing a display element, such that the display element may be formed on the first substrate and the release layer at the same time during the process of depositing the display element. Therefore, a hollow portion may be formed on the first substrate at the same time when removing the release layer. Further, a first packaging portion surrounding the through hole may be formed in the hollow portion during the encapsulation process, and external water and/or oxygen may be prevented permeating via the through hole and contacting with the display element, which avoids affecting the display performance of the display element and even leads to invalidation of the display element, and improves the service life of the display panel.

BRIEF DESCRIPTION OF THE DRAWINGS

Other features, objects and advantages of the present disclosure will become more apparent by describing its non-limiting embodiments in detail with reference to the following accompanying drawings.

DETAILED DESCRIPTION

Technical contents of the present disclosure will be further described in combination with the accompanying drawings and embodiments.

A First Embodiment

FIG. 1 to FIG. 8 show a flow chart of a method of manufacturing a display panel and structural schematic diagrams after each step is completed during the manufacturing process according to a first embodiment of the present disclosure, respectively. Specifically, the method of manufacturing a display panel includes following steps.

In step S100, a first substrate is provided, and a release layer is formed on the first substrate. In an embodiment, the release layer is located in a central region of the first substrate. A ployimide material or an organic photoresist is coated on the first substrate, and the release layer is formed after exposure and development.

Figure 1:
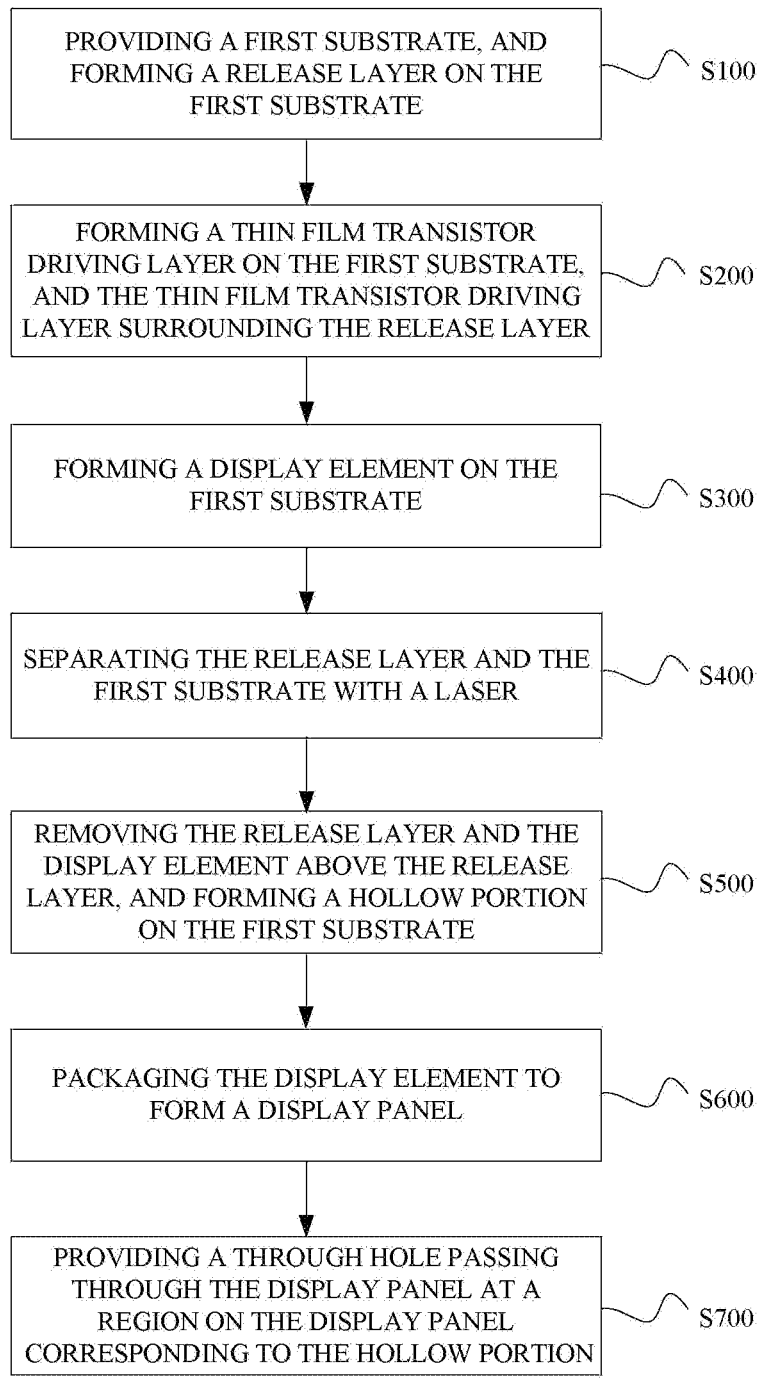
FIG. 1 is a flow chart of a method of manufacturing a display panel according to a first embodiment of the present disclosure.
Figure 2:
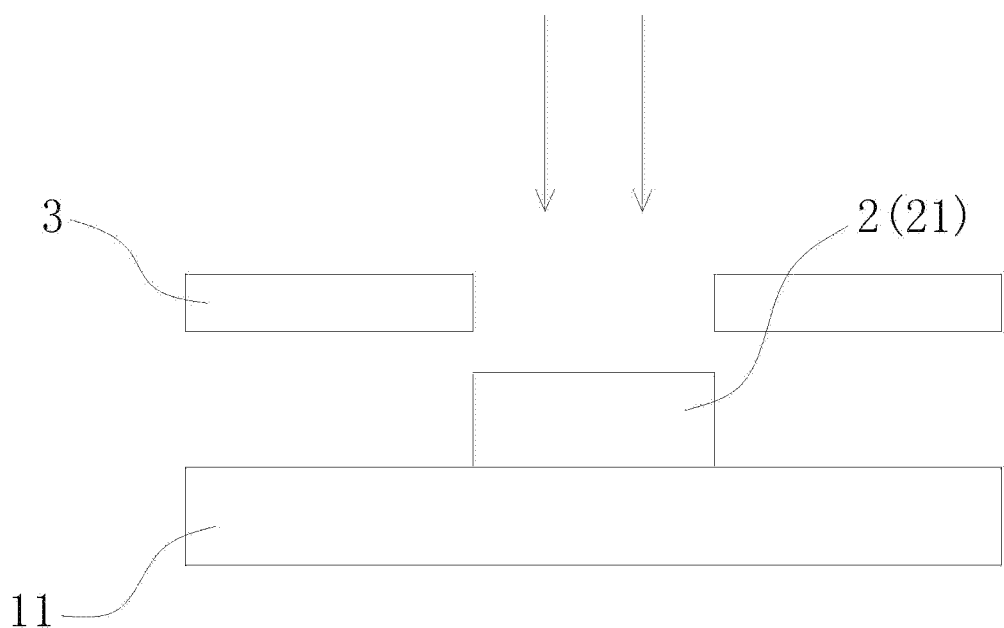
FIG. 2 is a structural schematic diagram of a negative photoresist formed on a first substrate and a release layer formed after exposure and development according to a first embodiment of the present disclosure.

Specifically, referring to FIG. 2, in an embodiment of the present disclosure, the release layer is formed by following manners. After a layer of negative photoresist 21 is coated on the first substrate 11, the negative photoresist 21 is exposed and developed. During the process of exposure and development, the negative photoresist 21 is shielded with a mask plate 3. In the embodiment, a size of the mask plate 3 is adapted to a size of the negative photoresist 21, and a center region of the mask plate 3 has an opening. A region on the negative photoresist 21 corresponding to the opening is not dissolved in the developing solution after being irradiated with light, and the remaining region is completely dissolved in the developing solution. After removal, a part of the negative photoresist 21 which is not dissolved in the developing solution forms a release layer 2.

Figure 3:
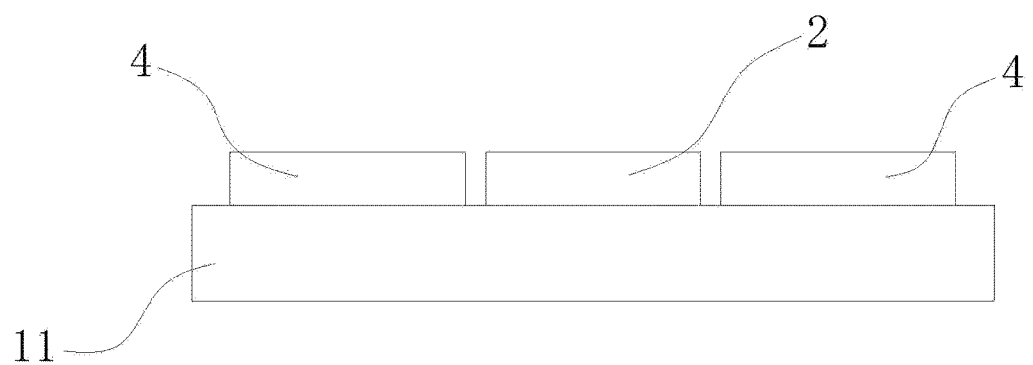
FIG. 3 is a structural schematic diagram of the first substrate after a thin film transistor driving layer is formed thereon according to a first embodiment of the present disclosure.

In step S200, a thin film transistor driving layer is formed on the first substrate, and the thin film transistor driving layer surrounds the release layer. Specifically, the thin film transistor driving layer is formed by using a yellow light process (i.e., by steps such as exposure and development). As shown in FIG. 3, the thin film transistor driving layer 4 is disconnected at a position where the release layer 2 is located, i.e., the thin film transistor driving layer 4 is spaced from the release layer 2.

Figure 4:
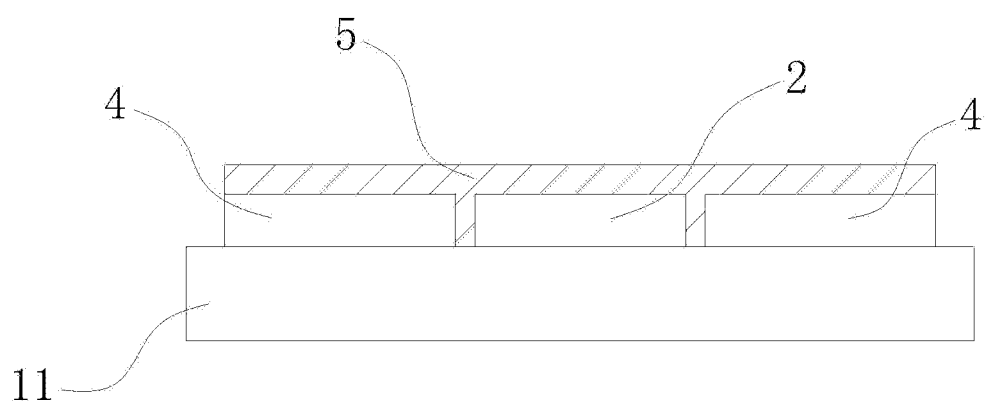
FIG. 4 is a structural schematic diagram of the first substrate after a display element is formed thereon according to a first embodiment of the present disclosure.
Figure 5:
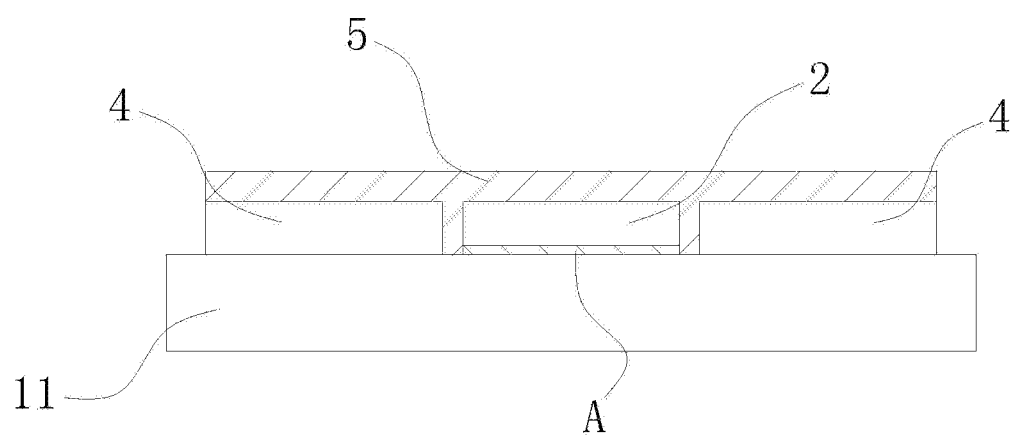
FIG. 5 is a structural schematic diagram of separating the release layer and the first substrate with a laser according to a first embodiment of the present disclosure.

In step S300, a display element is formed on the first substrate, a part of the display element forms above the release layer and another part of the display element forms above the thin film transistor driving layer. Specifically, the display element 5 is formed on the first substrate 11 shown in FIG. 3 by deposition (e.g., vapor deposition), as shown in FIG. 4. Since the release layer 2 and the thin film transistor driving layer 4 have already been formed on the first substrate 11, during the deposition of the display element 5, a part of the display element 5 is formed on the release layer 2 and another part of the display element 5 is deposited on the thin film transistor driving layer 4. It should be noted that, in the embodiment of the present disclosure, the display device 5 is an OLED display device and has a structure similar to any of existing OLED display elements. For example, the display element 5 may include an anode, a light emitting layer and a cathode. During the manufacturing process, the anode, the light emitting layer and the cathode are successively deposited on the thin film transistor driving layer 4, which will not be elaborated herein.

In step S400, a bonding between the release layer and the first substrate is broken with a laser. It should be noted that, the bonding formed between the release layer and the first substrate means a chemical bonding generated between the release layer and the first substrate after the release layer is subjected to high temperature curing during the manufacturing process of the display panel (since the thin film transistor driving layer or the display element of the display panel is formed by high temperature deposition or the like, the release layer will also be cured accordingly due to high temperature in these steps).

Specifically, the step of breaking with the laser utilizes the laser to focus between the release layer and the first substrate. In an embodiment, the step of breaking using the laser is carried out under a nitrogen environment, so as to avoid the display element contacting with water and/or oxygen. In the embodiment shown in FIG. 5, a shadow area A is a position of the bonding formed between the release layer 2 and the first substrate 11, i.e., a position broken with the laser. In the embodiment, the laser is incident from a side of the first substrate 1 away from the release layer 2 (i.e., a lower surface of the first substrate 11 in FIG. 5) and is focused on the shadow region A. In an embodiment of the present disclosure, in order to precisely focus the laser on the shadow region A, a positioning mark may be made on the display panel to serve as a positioning reference. Further, in this step, the laser will be focused according to a position to be focused which is calculated based on a designed value and the positioning reference. Alternatively, in other embodiments of the present disclosure, in this step, it is also possible to irradiate a side of the first substrate 11 away from the release layer 2 (i.e., the lower surface of the first substrate 11 in FIG. 5) with the laser after being shielded with the mask plate (i.e., the mask plate 3 in FIG. 3) in the above step S100. Since the mask plate 3 in FIG. 3 is the mask plate for forming the release layer 2, the opening thereof corresponds to the shadow area A, which may correspond to make a positioning mark on the display panel, and the laser may be precisely focused on the shadow area A, which will not be elaborated herein.

After the laser is absorbed by the release layer 2, the bonding between the release layer 2 and the first substrate 11 is broken, and thus the release layer 2 and the first substrate 11 are in a peelable state, and are separated.

Figure 6:
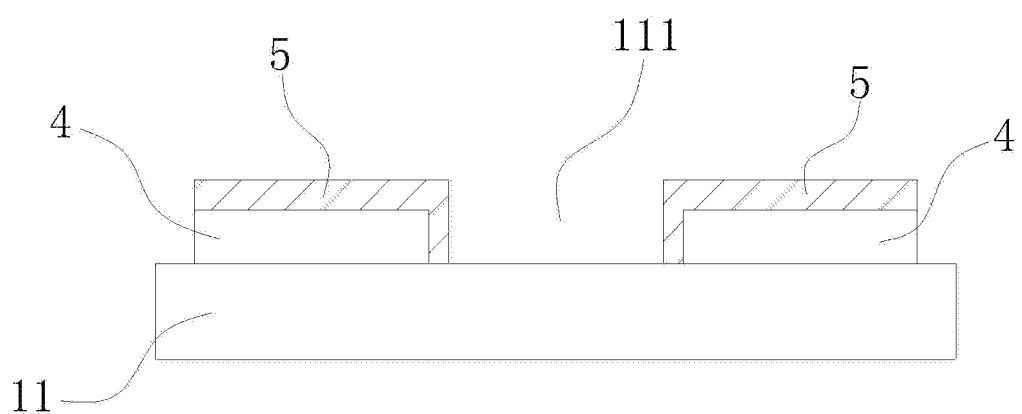
FIG. 6 is a structural schematic diagram after removing the release layer and the display element on the release layer according to a first embodiment of the present disclosure.

In step S500, the release layer and the display element above the release layer are removed, and a hollow portion is formed on the first substrate. Specifically, the step of removing the release layer and the display element above the release layer is carried out in a nitrogen environment, so as to avoid the display element contacting with water and/or oxygen. During the removal of the release layer 2, the partial display element 5 on the release layer 2 is also removed along with the release layer 2. As shown in FIG. 6, a hollow portion 111 corresponding to the size of the release layer 2 is formed on the first substrate 11 after the release layer 2 is removed. In the embodiment of the present disclosure, by breaking the bonding between, or separating, the release layer and the first substrate using the laser and removing the release layer and the display element on the release layer, during the removal of the release layer, the display element on the release layer can be also removed together, and any display element will not be left at the hollow portion with the release layer removed (i.e., it is possible to prevent a part of the display element on the release layer from being left in the hollow portion). Therefore, the subsequent packaging process may be effectively performed, so as to avoid the remaining display element affecting the packaging process.

In step S600, the display element is packaged to form a display panel. The display panel at least includes a first packaging portion formed on the first substrate and surrounding an edge provided at the hollow portion. Particularly, in this embodiment, the step of packaging the display element includes following sub-steps.

A packaging adhesive is coated on the first substrate 11, the packaging adhesive is coated surround the hollow portion 111 and the display element 5, respectively.

Figure 7:
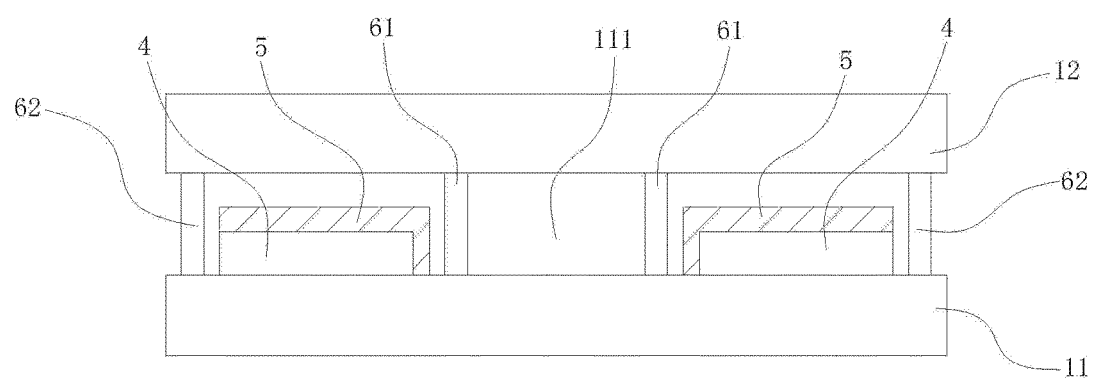
FIG. 7 is a structural schematic diagram of the display panel after being packaged with a packaging adhesive according to a first embodiment of the present disclosure.

Further, after a second substrate 12 is covered above the first substrate 11, the packaging adhesive is cured to form the first packaging portion 61 and a second packaging portion 62. The first packaging portion 61 is formed by curing the packaging adhesive surrounding the hollow portion 111, and the second packaging portion 62 is formed by curing the packaging adhesive surrounding the display element 5. In the present embodiment, the first packaging portion 61 and the second packaging portion 62 may be made of a UV curing adhesive or a glass cement material. When the first packaging portion 61 and the second packaging portion 62 are made of ultraviolet curing adhesives, the ultraviolet curing adhesive is cured after being irradiated by ultraviolet ray to be bonded between the first substrate 11 and the second substrate 12. When the first packaging portion 61 and the second packaging portion 62 are made of glass cements, the glass cement is bonded between the first substrate 11 and the second substrate 12 after laser sintering, which will not be elaborated herein. After being packaged, the display panel as shown in FIG. 7 is formed.

Figure 8:
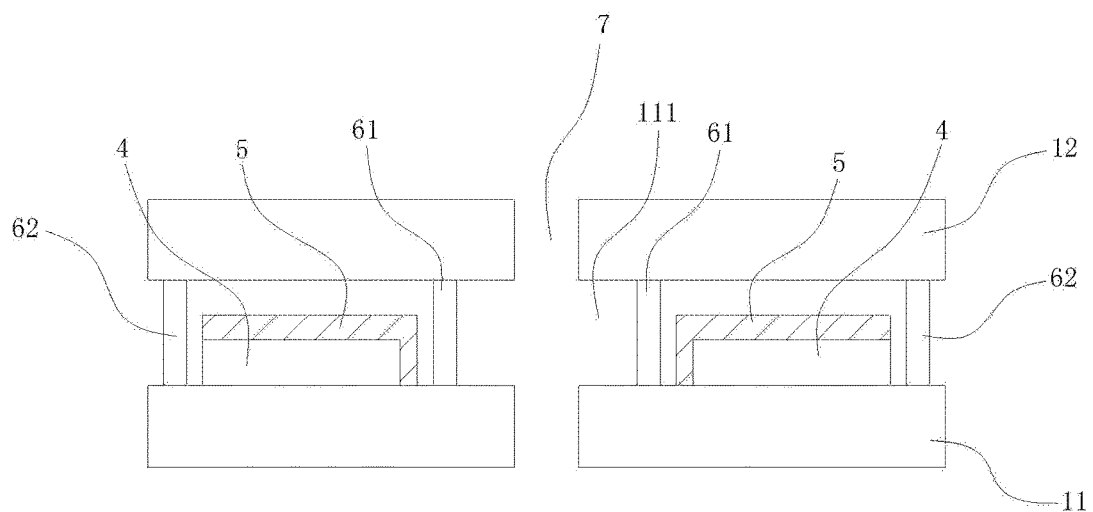
FIG. 8 is a structural schematic diagram of the display panel after a through hole is provided thereon according to a first embodiment of the present disclosure.

In step S700, a through hole passing through the display panel is provided at a region on the display panel corresponding to the hollow portion. Specifically, a through hole 7 is provided on the display panel as shown in FIG. 7. The through hole 7 penetrates through the display panel in a direction of perpendicular to the plane where the first substrate 11 and the second substrate 12 are located, and corresponds to the hollow portion 111 on the first substrate 11. In the embodiment, the through hole 7 may be formed by mechanical drilling (e.g., cutter cutting) or laser drilling. In the embodiment as shown in FIG. 8, the through hole 7 is provided at a center of the display panel, and a diameter of the through hole 7 is 1 cm to 3 cm. As shown in FIG. 8, after the through hole 7 is provided, the first packaging portion 61 surrounds the through hole 7 and is positioned between the through hole 7 and the display element 5, so as to form a display panel with a through hole, which will not be elaborated herein.

Further, after the above steps are completed, the first substrate 11 of the display panel may be bonded to a flexible circuit board (not shown). The flexible circuit board includes an IC driving circuit for controlling the display panel, which will not be elaborated herein.

In the first embodiment as shown in FIG. 1 to FIG. 8, since the method of manufacturing a display panel utilizes the method of forming a release layer in advance, after the release layer is removed, a hollow portion may be formed on a first substrate, and then packaging may be performed on the hollow portion. After the packaging is completed, the display element 5 is located in a closed space formed by the first substrate 11, the second substrate 12, the first packaging portion 61 and the second packaging portion 62. The first packaging portion 61 may effectively prevent external water and/or oxygen permeating due to the through hole 7 provided on the display panel, which affects the display performance of the display element 5 and even causes invalidation of the display element.

A Second Embodiment

Figure 9:
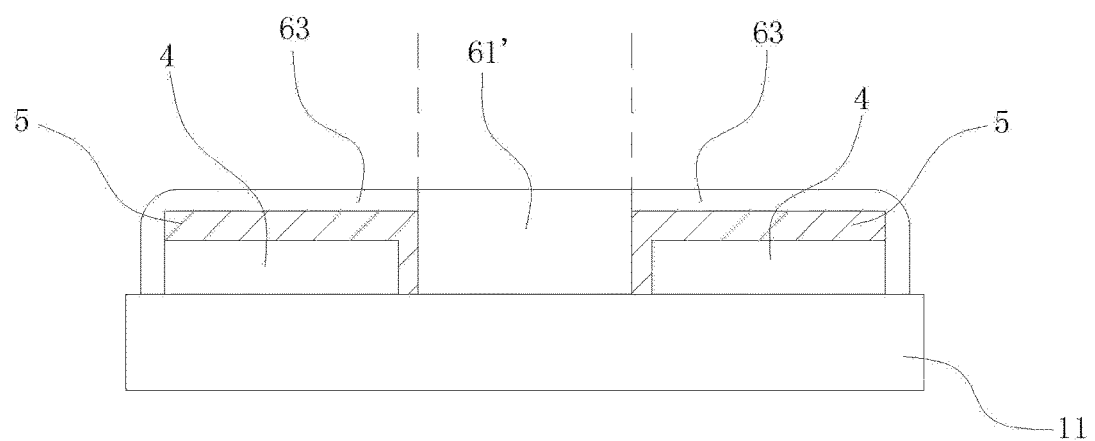
FIG. 9 is a structural schematic diagram of a display panel after being packaged according to a second embodiment of the present disclosure.
Figure 10:
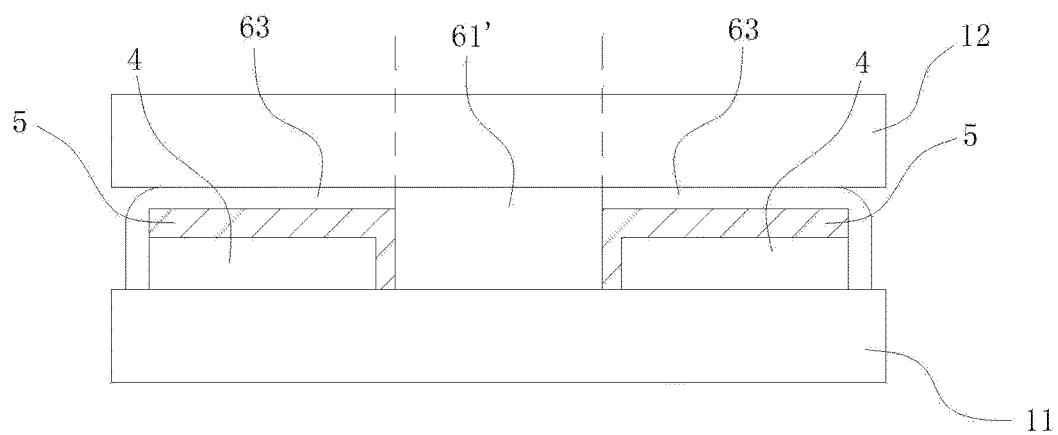
FIG. 10 is a structural schematic diagram of the display panel shown in FIG. 9 with a second substrate covered thereon according to a second embodiment of the present disclosure.
Figure 11:
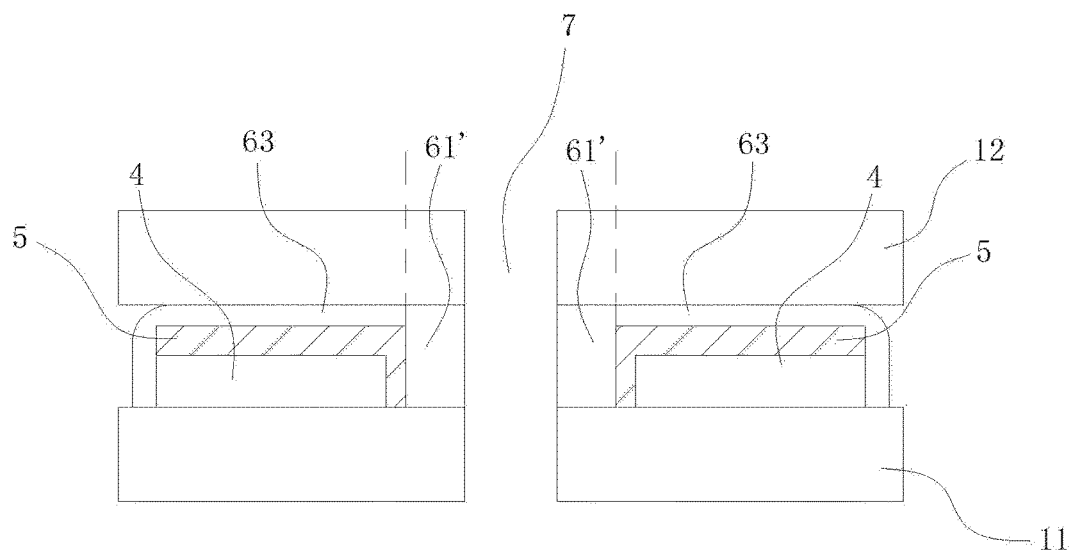
FIG. 11 is a structural schematic diagram of the display panel after a through hole is provided thereon according to a second embodiment of the present disclosure.

FIG. 9 is a structural schematic diagram of a display panel after being packaged according to a second embodiment of the present disclosure, FIG. 10 is a structural schematic diagram of the display panel with a second substrate covered thereon according to a second embodiment of the present disclosure, and FIG. 11 is a structural schematic diagram of the display panel after a through hole is provided thereon according to a second embodiment of the present disclosure. The difference from the first embodiment as shown in FIG. 1 to FIG. 8 described above lies in that, in this embodiment, the display panel is packaged using a thin film packaging technique. Specifically, as shown in FIG. 9 to FIG. 11, in this embodiment, the packaging step of the display panel is different from the step S600 in the first embodiment described above. In the embodiment, the step of packaging the display element includes following sub-steps.

An organic thin film layer and an inorganic thin film layer are alternatingly deposited on the first substrate 11 until the display element 5 is covered. The inorganic thin film layer and the organic thin film layer form the first packaging portion 61' and a third packaging portion 63. The first packaging portion 61' forms at the hollow portion 111. The third packaging portion 63 surrounds and covers the display element 5, and collectively clads the display element 5 together with the first packaging portion 61'. Referring to FIG. 9, the first packaging portion 61' is a part between two dashed lines as shown in FIG. 9. In an embodiment, the organic thin film layer is made of acrylate-based resin material, and the inorganic thin film layer is made of silicon nitride material, aluminium oxide material or titanium dioxide material. It should be noted that, the first packaging portion 61' and the third packaging portion 63 are collectively formed on the first substrate 11 by deposition, and thus the first packaging portion 61' and the third packaging portion 63 may be regarded as a whole.

Further, as shown in FIG. 10, the second substrate 12 is covered above the packaged display panel as shown in FIG. 9, that is, above the first packaging portion 61' and the third packaging portion 63. The second substrate 12 may protect a surface of the display panel. It should be noted that, in other embodiments of the present disclosure, this step may also be omitted. For example, the upside of the first packaging portion 61' and the third packaging portion 63 may be directly attached to a touch panel to realize a touch function, which will not be repeated herein.

Further, an opening is to be provided in the above-mentioned providing the display panel. In the process of providing the through hole 7 in the display panel of FIG. 10, since the through hole 7 corresponds to the hollow portion 111 of the first substrate 11, and the first packaging portion 61' is provided in the hollow portion 111 in this embodiment, the through hole 7 passes through the first packaging portion 61', the first substrate 11 and the second substrate 12. Further, after the through hole 7 is provided, the first packaging portion 61' surrounds the through hole 7. Further, a display panel having the through hole is formed. Similarly to the above-mentioned first embodiment, the first packaging portion 61' may also effectively prevent external water and/or oxygen permeating via the through hole 7 provided on the display panel, which affects the display performance of the display panel 5 and even leads to invalidation of the display element 5.

In summary, the method of manufacturing a display panel according to the present disclosure combines photolithography technique with evaporation technique, a release layer is formed on a first substrate through the photolithography technique prior to depositing a display element, such that the display element may be formed on the first substrate and the release layer at the same time during the process of depositing the display element. Therefore, a hollow portion may be formed on the first substrate at the same time when removing the release layer. Further, a first packaging portion surrounding the through hole may be formed in the hollow portion during the encapsulation process, and external water and/or oxygen may be prevented permeating via the through hole and contacting with the display element, which avoids affecting the display performance of the display element and even leads to invalidation of the display element, and improves the service life of the display panel.

Although the present disclosure has been described above with reference to embodiments, it is not intended to limit the present disclosure. It will be apparent to those skilled in the art that various changes and modifications may be made without departing from the spirit and scope of the present disclosure. Accordingly, the protection scope of the present disclosure is defined by the scope defined by the appended claims.

What is claimed is:

1. A method of manufacturing a display panel, comprising following steps:
   providing a first substrate, and forming a release layer on the first substrate;
   forming a thin film transistor driving layer on the first substrate, and the thin film transistor driving layer surrounding the release layer;
   forming a display element on the first substrate, wherein a part of the display element forms above the release layer and another part of the display element forms above the thin film transistor driving layer;
   separating the release layer and the first substrate with a laser;
   removing the release layer and the display element above the release layer, and forming a hollow portion on the first substrate;
   packaging the display element to form a display panel, wherein the display panel at least comprises a first packaging portion formed on the first substrate and at least surrounding the hollow portion; and
   providing a through hole passing through the display panel at a region on the display panel corresponding to the hollow portion, and the first packaging portion surrounding the through hole.

2. The method of manufacturing a display panel according to claim 1, wherein during the step of forming the release layer on the first substrate, a ployimide material or an organic photoresist is coated on the first substrate, and the release layer is formed after exposure and development.

3. The method of manufacturing a display panel according to claim 1, wherein the step of packaging the display element further comprises following sub-steps:
   coating a packaging adhesive on the first substrate, wherein the packaging adhesive is coated surround the hollow portion and the display element, respectively;
   covering a second substrate above the first substrate; and
   curing the packaging adhesive to form the first packaging portion and a second packaging portion, and bonding the first substrate and the second substrate, wherein the first packaging portion surrounds the hollow portion and the second packaging portion surrounds the display element.

4. The method of manufacturing a display panel according to claim 3, wherein the packaging adhesive is a ultraviolet curing adhesive, which is cured after being irradiated by a ultraviolet ray to bond the first substrate and the second substrate.

5. The method of manufacturing a display panel according to claim 3, wherein the packaging adhesive is a glass cement, which is cured after laser sintering to bond the first substrate and the second substrate.

6. The method of manufacturing a display panel according to claim 1, wherein the step of packaging the display element further comprises following sub-steps:

alternatingly depositing an inorganic thin film layer and an organic thin film layer on the first substrate until the display element is covered, wherein the inorganic thin film layer and the organic thin film layer form the first packaging portion and a third packaging portion, the first packaging portion forms at the hollow portion, and the third packaging portion surrounds and covers the display element.

7. The method of manufacturing a display panel according to claim 6, wherein the organic thin film layer is made of acrylate-based resin material, and the inorganic thin film layer is made of silicon nitride material, aluminium oxide material or titanium dioxide material.

8. The method of manufacturing a display panel according to claim 1, wherein the step of separating the release layer and the first substrate with the laser is performed in a nitrogen environment.

9. The method of manufacturing a display panel according to claim 1, wherein the step of removing the release layer and the display element above the release layer is performed in a nitrogen environment.

10. The method of manufacturing a display panel according to claim 1, wherein the through hole provided on the display panel has a diameter of 1 cm to 3 cm.

* * * * *